United States Patent
Jia et al.

(10) Patent No.: US 11,210,210 B2
(45) Date of Patent: Dec. 28, 2021

(54) READ LATENCY REDUCTION METHOD AND APPARATUS

(71) Applicant: Huawei Technologies Co., Ltd., Shenzhen (CN)

(72) Inventors: Xuechao Jia, Hangzhou (CN); Jea Woong Hyun, Shenzhen (CN); Tian Xia, Hangzhou (CN); Linfeng Chen, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/884,158

(22) Filed: May 27, 2020

(65) Prior Publication Data

US 2020/0285575 A1    Sep. 10, 2020

Related U.S. Application Data

(63) Continuation of application No. PCT/CN2018/116257, filed on Nov. 19, 2018.

(30) Foreign Application Priority Data

Nov. 27, 2017    (CN) ......................... 201711208323.X

(51) Int. Cl.
*G06F 12/02*    (2006.01)
*G06F 11/07*    (2006.01)
(Continued)

(52) U.S. Cl.
CPC ........ *G06F 12/0246* (2013.01); *G06F 11/076* (2013.01); *G06F 11/0772* (2013.01);
(Continued)

(58) Field of Classification Search
CPC ............... G06F 12/0246; G06F 11/076; G06F 11/0772; G06F 11/3037; G06F 12/0882;
(Continued)

(56) References Cited

U.S. PATENT DOCUMENTS 8,072,805 B2    12/2011    Chou et al.
8,125,827 B2    2/2012    Park
(Continued)

FOREIGN PATENT DOCUMENTS

CN    101405813 A        4/2009
CN    102543196 A    *    7/2012
(Continued)

OTHER PUBLICATIONS

Mingkuo, Q., et al., "2006 Special Training for Network Administrators," Zhilian Education, Sichuan Publishing Group, 2006, with an English Abstract, provided the related part, total 6 pages.

*Primary Examiner* — Fernando Hidalgo
(74) *Attorney, Agent, or Firm* — Conley Rose, P.C.

(57) ABSTRACT

A read latency reduction method includes receiving a read request sent by a host, where the read request includes location indication information of requested data, obtaining, from read voltage management information based on a first physical location indicated by the location indication information, a read voltage corresponding to a first storage area in which the first physical location is located, the flash array includes a plurality of storage areas, the read voltage management information includes a correspondence between a storage area and a read voltage, and the read voltage in the read voltage management information is dynamically updated, and obtaining the requested data based on the read voltage corresponding to the first storage area, and sending the requested data to the host.

20 Claims, 9 Drawing Sheets

(51) Int. Cl.
  *G06F 11/30* (2006.01)
  *G06F 12/0882* (2016.01)
  *G11C 11/4074* (2006.01)
  *G11C 11/408* (2006.01)
(52) U.S. Cl.
  CPC ...... *G06F 11/3037* (2013.01); *G06F 12/0882* (2013.01); *G11C 11/4074* (2013.01); *G11C 11/4085* (2013.01); *G06F 2212/1024* (2013.01)
(58) Field of Classification Search
  CPC ........... G06F 2212/1024; G06F 3/0658; G06F 3/0611; G06F 3/0634; G06F 3/0679; G06F 3/0616; G06F 3/0688; G11C 11/4074; G11C 11/4085; G11C 11/413
  USPC ........................................................ 711/154
  See application file for complete search history.

(56) References Cited

U.S. PATENT DOCUMENTS

| | | | |
|---|---|---|---|
| 9,244,763 | B1 | 1/2016 | Kankani et al. |
| 9,606,864 | B2 | 3/2017 | Lee et al. |
| 2007/0297226 | A1 | 12/2007 | Mokhlesi |
| 2009/0003058 | A1 | 1/2009 | Kang |
| 2013/0314988 | A1 | 11/2013 | Desireddi et al. |
| 2014/0064010 | A1 | 3/2014 | Barkley et al. |
| 2014/0229131 | A1 | 8/2014 | Cohen et al. |
| 2014/0237157 | A1 | 8/2014 | Takefman et al. |
| 2015/0339057 | A1 | 11/2015 | Choi et al. |
| 2016/0179412 | A1 | 6/2016 | Camp et al. |
| 2016/0276039 | A1 | 9/2016 | Cai et al. |
| 2017/0271031 | A1 | 9/2017 | Sharon et al. |
| 2021/0027846 | A1* | 1/2021 | Malshe ................. G11C 16/26 |

FOREIGN PATENT DOCUMENTS

| | | |
|---|---|---|
| CN | 102543196 A | 7/2012 |
| CN | 104102598 A | 10/2014 |
| CN | 104347113 A | 2/2015 |
| CN | 104461399 A | 3/2015 |
| CN | 104737232 A | 6/2015 |
| CN | 106169308 A | 11/2016 |

* cited by examiner

READ LATENCY REDUCTION METHOD AND APPARATUS

CROSS-REFERENCE TO RELATED APPLICATIONS

This application is a continuation of International Patent Application No. PCT/CN2018/116257, filed on Nov. 19, 2018, which claims priority to Chinese Patent Application No. 201711208323.X, filed on Nov. 27, 2017. The disclosures of the aforementioned applications are hereby incorporated by reference in their entireties.

TECHNICAL FIELD

Embodiments of this application relate to the field of data storage technologies, and in particular, to a read latency reduction method and an apparatus.

BACKGROUND

A solid state drive (SSD) is a storage medium such as a hard disk or a storage card that is made using a solid-state electronic storage chip array. Quality of service (QoS) of the SSD is a capability of an SSD product for providing a host with a stable, consistent, and predictable request response service, and is one of key factors for building competitiveness of the SSD product. The SSD may be applied to a scenario such as a data center or a server. Read latency is a key performance indicator of the QoS, and mainly depends on a count of reads occurring in a flash medium that responds to a host input/output (TO) request. A flash serves as a main storage medium of the SSD, and a feature of the flash is affected by a plurality of factors such as program/erase cycles (PE) and a data retention time. A voltage signal that carries data is drifted, and consequently a plurality of reads are required to successfully respond to the host IO request. As a result, the read latency in the QoS is relatively long.

Currently, in other approaches, the read latency may be reduced using a read voltage prefabrication table technology. In an embodiment, a relationship between a factor affecting a read voltage and a voltage offset is analyzed, and an impact factor and read voltage compensation table is formulated, or a specific formula is summarized using a fitting method. In practice, the read voltage is compensated after table lookup or calculation based on an impact factor value in order to improve a first read success rate, and further shorten the read latency. However, the read voltage prefabrication table technology is related to a collected sample. Different read voltage prefabrication tables need to be formulated for different storage media, causing relatively heavy workload. In addition, the storage medium changes in a use process, reliability of using the read voltage prefabrication table technology is relatively low, and an amplitude of increasing the first read success rate is limited. As a result, a read latency reduction effect is poor.

SUMMARY

Embodiments of this application provide a read latency reduction method and an apparatus in order to resolve a problem of a relatively long read latency in other approaches.

To achieve the foregoing objectives, the following technical solutions are used in the embodiments of this application.

According to a first aspect, a read latency reduction method is provided, where the method is applied to a controller, a front end of the controller is connected to a host, and a back end of the controller is connected to a flash array, and the method includes receiving, by the controller, a read request sent by the host, where the read request includes location indication information of requested data, obtaining, by the controller from read voltage management information based on a first physical location indicated by the location indication information, a read voltage corresponding to a first storage area in which the first physical location is located, where the first physical location is a physical location of the requested data in the flash array, the flash array includes a plurality of storage areas, physical characteristics of a plurality of physical locations included in a same storage area are identical or similar, the read voltage management information includes a correspondence between a storage area and a read voltage, and the read voltage in the read voltage management information is dynamically updated, and obtaining, by the controller, the requested data based on the read voltage corresponding to the first storage area, and sending the requested data to the host. In the foregoing technical solution, because physical characteristics and read voltage characteristics of a plurality of physical locations included in the first storage area are identical or similar, and the read voltage in the read voltage management information is dynamically updated, accuracy of the read voltage obtained by the controller can be ensured. When the requested data is obtained based on the read voltage, a first read success rate can be improved, a count of reads can be reduced, and a read latency can be reduced.

In a possible implementation of the first aspect, read voltage characteristics of physical locations included in a same storage area are identical or similar, and/or physical characteristics of physical locations included in different storage areas are different, and/or read voltage characteristics of physical locations included in different storage areas are different. In the foregoing possible implementation, a plurality of physical locations whose physical characteristics are identical or similar and/or whose read voltage characteristics are identical or similar are allocated to a same storage area, and correspond to one read voltage in the read voltage management information such that overheads of a memory in the controller can be reduced.

In a possible implementation of the first aspect, for any storage area in the plurality of storage areas, the method further includes updating, by the controller when a preset update condition is met, a read voltage corresponding to the storage area in the read voltage management information. In the foregoing possible implementations, dynamically updating the read voltage in the read voltage management information can ensure that the read voltage is real-time and effective such that a success rate of obtaining requested data using the read voltage is relatively high, and a read latency is reduced.

In a possible implementation of the first aspect, that the read voltage in the read voltage management information is dynamically updated includes the updating, by the controller when a preset update condition is met, a read voltage corresponding to the storage area in the read voltage management information includes, when the controller is in a system idle time window or a preset update period is met, determining, by the controller, a first error parameter at the read voltage corresponding to the storage area, and when the first error parameter is greater than or equal to a first threshold, updating, by the controller, the read voltage corresponding to the storage area in the read voltage management information. In the foregoing possible implementations, the controller actively and dynamically updates the read voltage in the read voltage management information. This can ensure that the read voltage is real-time and effective such that a success rate of obtaining requested data using the read voltage is relatively high, and a read latency is reduced.

In a possible implementation of the first aspect, the preset update period is related to a use state of the storage area, or the preset update period is related to an average service life of the plurality of storage areas included in the flash array. In the foregoing possible implementations, a proper preset update period is set, and the read voltage in the read voltage management information is dynamically updated based on the preset update period. This can ensure that the read voltage is real-time and effective, avoid unnecessary update operations, and reduce energy consumption of the controller.

In a possible implementation of the first aspect, the updating, by the controller when a preset update condition is met, a read voltage corresponding to the storage area in the read voltage management information includes, when a second error parameter of requested data that is first read is greater than or equal to the first threshold at the read voltage corresponding to the storage area, updating, by the controller, the read voltage corresponding to the storage area in the read voltage management information. In the foregoing possible implementations, the controller passively and dynamically updates the read voltage in the read voltage management information such that the read voltage can be quickly and effectively updated after reading data for the first time using the read voltage fails, a count of reads can be reduced, and a read latency can be reduced.

In a possible implementation of the first aspect, for any storage area in the plurality of storage areas, when the controller updates, within a first time period, a read voltage corresponding to the storage area in the read voltage management information, and obtains, within a second time period, the read voltage corresponding to the storage area from the read voltage management information, the first time period and the second time period do not overlap, and/or for any two storage areas in the plurality of storage areas, when the controller updates, within a third time period, a read voltage corresponding to one storage area in the read voltage management information, and obtains, within a fourth time period, a read voltage corresponding to the other storage area from the read voltage management information, the third time period and the fourth time period overlap, or the third time period and the fourth time period do not overlap. In the foregoing possible implementations, the controller may perform different operations on the read voltage management information in different time periods, thereby saving time for managing the read voltage management information and improving system performance.

In a possible implementation of the first aspect, one storage area includes at least one storage unit, and the storage unit includes at least one of the following a device, a die, a plane, a block, a super block, a layer, a sub-block, a word line (WL), and a page. In the foregoing possible implementations, the controller properly divides the storage area such that a data amount of the read voltage management information can be reduced, and overheads of a memory in the controller can be reduced.

According to a second aspect, a controller is provided, where a front end of the controller is connected to a host, a back end of the controller is connected to a flash array, and the controller includes a receiving unit configured to receive a read request sent by the host, where the read request includes location indication information of requested data, a processing unit configured to obtain, from read voltage management information based on a first physical location indicated by the location indication information, a read voltage corresponding to a first storage area in which the first physical location is located, where the first physical location is a physical location of the requested data in the flash array, the flash array includes a plurality of storage areas, physical characteristics of a plurality of physical locations included in a same storage area are identical or similar, the read voltage management information includes a correspondence between a storage area and a read voltage, and the read voltage in the read voltage management information is dynamically updated, the processing unit is further configured to obtain the requested data based on the read voltage corresponding to the first storage area, and a sending unit configured to send the requested data to the host.

In a possible implementation of the second aspect, read voltage characteristics of physical locations included in a same storage area are identical or similar, and/or physical characteristics of physical locations included in different storage areas are different, and/or read voltage characteristics of physical locations included in different storage areas are different.

In a possible implementation of the second aspect, the processing unit is further configured to, for any storage area in the plurality of storage areas, when a preset update condition is met, update a read voltage corresponding to the storage area in the read voltage management information such that the read voltage in the read voltage management information is dynamically updated.

In a possible implementation of the second aspect, the processing unit is further configured to, when the controller is in a system idle time window or a preset update period is met, determine a first error parameter at the read voltage corresponding to the storage area, and when the first error parameter is greater than or equal to a first threshold, update the read voltage corresponding to the storage area in the read voltage management information.

In a possible implementation of the second aspect, the preset update period is related to a use state of the storage area, or the preset update period is related to an average service life of the plurality of storage areas included in the flash array.

In a possible implementation of the second aspect, the processing unit is further configured to, when a second error parameter of requested data that is first read is greater than or equal to the first threshold at the read voltage corresponding to the storage area, update the read voltage corresponding to the storage area in the read voltage management information.

In a possible implementation of the second aspect, for any storage area in the plurality of storage areas, when the read voltage corresponding to the storage area in the read voltage management information is updated within a first time period, and the read voltage corresponding to the storage area is obtained from the read voltage management information within a second time period, the first time period and the second time period do not overlap, and/or for any two storage areas in the plurality of storage areas, when a read voltage corresponding to one storage area in the read voltage management information is updated within a third time period, and a read voltage corresponding to the other storage area is obtained from the read voltage management information within a fourth time period, the third time period and the fourth time period overlap, or the third time period and the fourth time period do not overlap.

In a possible implementation of the second aspect, one storage area includes at least one storage unit, and the storage unit includes at least one of the following a device, a die, a plane, a block, a super block, a layer, a sub-block, a WL, and a page.

According to a third aspect, a system is provided, where the system includes a host, a controller, and a flash array, the flash array includes a plurality of storage areas, and physical characteristics of a plurality of physical locations included in a same storage area are identical or similar, the host is configured to send a read request to the controller and receive requested data returned by the controller, where the read request includes location indication information of the requested data, the controller is configured to manage read voltage management information, where the read voltage management information includes a correspondence between a storage area and a read voltage, and the read voltage in the read voltage management information is dynamically updated, the controller is further configured to, when the read request is received, obtain, from the read voltage management information based on a first physical location indicated by the location indication information, a read voltage corresponding to a first storage area in which the first physical location is located, where the first physical location is a physical location of the requested data in the flash array, and the controller is further configured to obtain the requested data based on the read voltage corresponding to the first storage area, and send the requested data to the host.

In a possible implementation of the third aspect, read voltage characteristics of physical locations included in a same storage area are identical or similar, and/or physical characteristics of physical locations included in different storage areas are different, and/or read voltage characteristics of physical locations included in different storage areas are different.

In a possible implementation of the third aspect, the controller is further configured to, for any storage area in the plurality of storage areas, when a preset update condition is met, update a read voltage corresponding to the storage area in the read voltage management information such that the read voltage in the read voltage management information is dynamically updated.

In a possible implementation of the third aspect, the controller is further configured to, when the controller is in a system idle time window or a preset update period is met, determine a first error parameter at the read voltage corresponding to the storage area, and when the first error parameter is greater than or equal to a first threshold, update the read voltage corresponding to the storage area in the read voltage management information.

In a possible implementation of the third aspect, the preset update period is related to a use state of the storage area, or the preset update period is related to an average service life of the plurality of storage areas in the flash array.

In a possible implementation of the third aspect, the controller is further configured to, when a second error parameter of requested data that is first read is greater than or equal to the first threshold at the read voltage corresponding to the storage area, update the read voltage corresponding to the storage area in the read voltage management information.

In a possible implementation of the third aspect, for any storage area in the plurality of storage areas, when the controller updates, within a first time period, a read voltage corresponding to the storage area in the read voltage management information, and obtains, within a second time period, the read voltage corresponding to the storage area from the read voltage management information, the first time period and the second time period do not overlap, and/or for any two storage areas in the plurality of storage areas, when the controller updates, within a third time period, a read voltage corresponding to one storage area in the read voltage management information, and obtains, within a fourth time period, a read voltage corresponding to the other storage area from the read voltage management information, the third time period and the fourth time period overlap, or the third time period and the fourth time period do not overlap.

In a possible implementation of the third aspect, one storage area includes at least one storage unit, and the storage unit includes at least one of the following a device, a die, a plane, a block, a super block, a layer, a sub-block, a WL, and a page.

Another aspect of this application provides a computer-readable storage medium, where the computer-readable storage medium stores an instruction. When the instruction runs on a computer, the computer performs the read latency reduction method according to any one of the first aspect or the possible implementations of the first aspect.

Still another aspect of this application provides a computer program product including an instruction. When the computer program product runs on a computer, the computer performs the read latency reduction method according to any one of the first aspect or the possible implementations of the first aspect.

It may be understood that any one of the above provided apparatus, computer storage medium, or computer program product for the read latency reduction method is configured to perform the corresponding method provided above. Therefore, for beneficial effects that can be achieved by the apparatus, the computer storage medium, or the computer program product, refer to beneficial effects in the corresponding method provided above. Details are not described herein again.

DESCRIPTION OF EMBODIMENTS

Currently, most storage devices use a SSD to store data, such as a hard disk or a storage card. QoS of the SSD is a capability of the storage device for providing a host with a stable, consistent, and predictable request response service, and is one of key factors that affect market competitiveness of the storage device. QoS may include a plurality of performance indicators, where a read latency is a key performance indicator of the QoS, and mainly depends on a count of reads occurring in a flash medium that responds to a host IO request. However, a flash medium serves as a main storage medium of the SSD, and a feature of the flash medium is affected by a plurality of factors such as PE cycles, a data retention time, and read counts. A voltage signal that carries data is drifted, and consequently a back end needs to perform a plurality of read operations (trial and error) to successfully respond to the host IO request. As a result, a read latency indicator of the QoS is affected, and the read latency is relatively long.

Figure 1A:
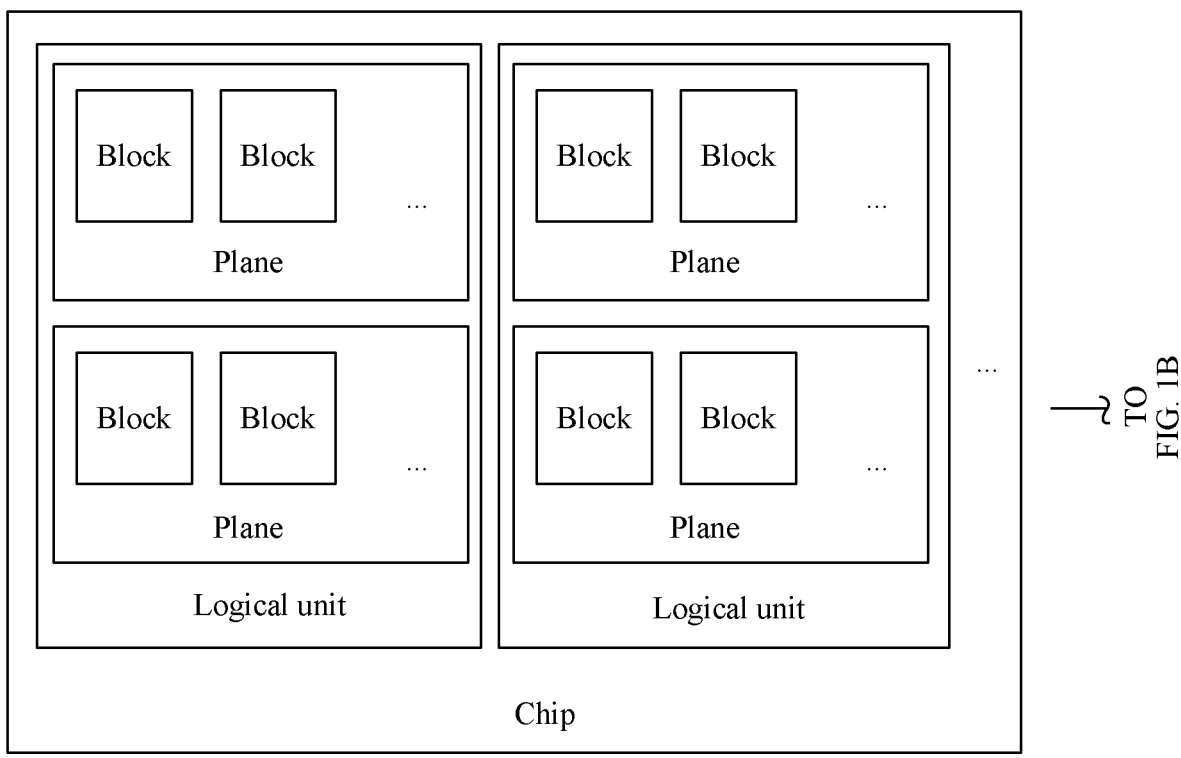
FIG. 1A is a schematic structural diagram of a storage device according to an embodiment of this application.
Figure 1B:
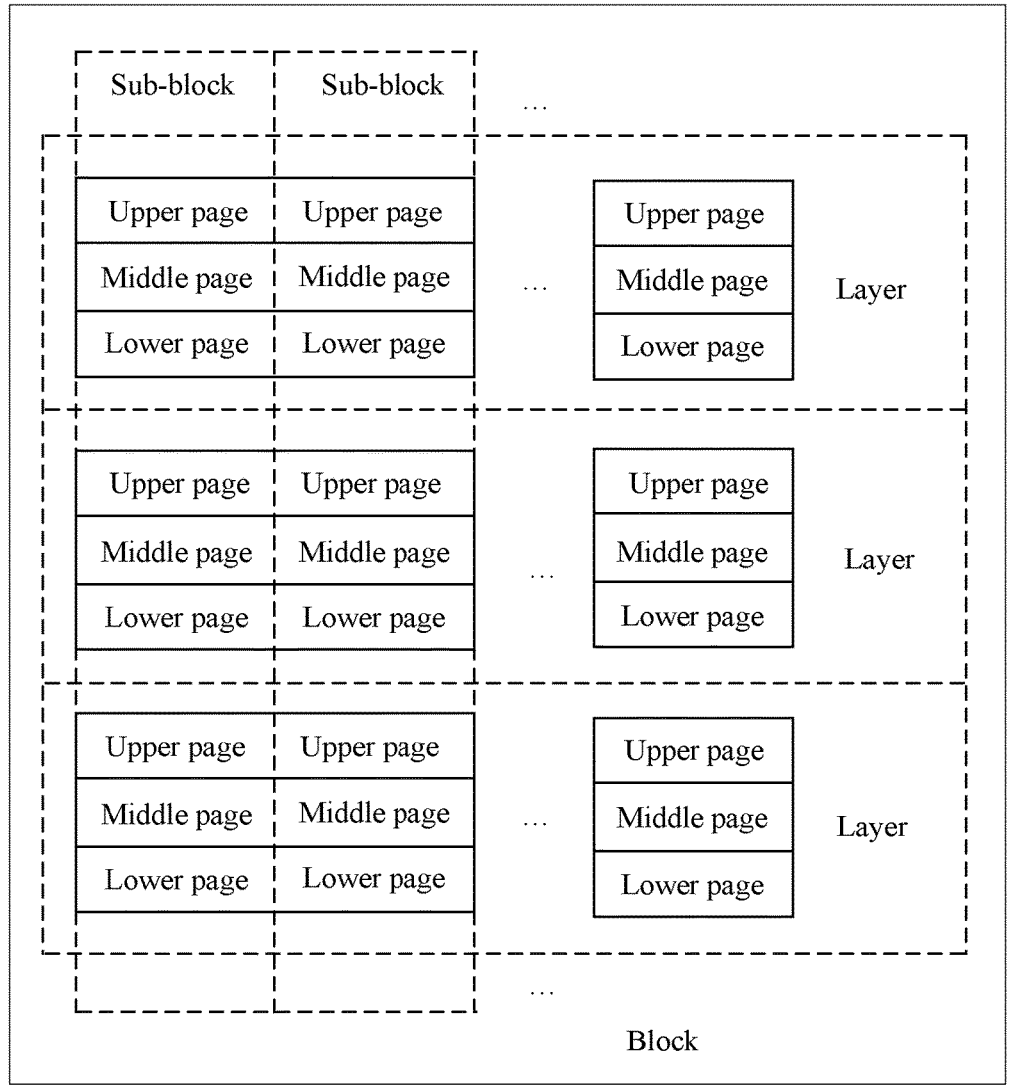
FIG. 1B is another schematic structural diagram of a storage device according to an embodiment of this application.

As a 3D Triple-Level Cell (TLC), a cell with a higher storage density, gradually replaces a 2D Multi-Level Cell (MLC) and becomes a mainstream storage medium, the read latency indicator of the QoS is facing more challenges. FIG. 1A and FIG. 1B are a diagram of an internal hierarchical structure of a device according to an embodiment of this application. A minimum unit of a write operation is a page, and the page may be classified into three types an upper page, a middle page, and a lower page. One upper page, one middle page, and one lower page may form one WL, and several WLs form a layer or sub-block in different directions. For example, in FIG. 1A and FIG. 1B, a plurality of WLs in a horizontal direction form a layer, and a plurality of WLs in a vertical direction form a sub-block. A minimum erasure operation unit formed by the page is referred to as a block. A plurality of blocks form a plane, and a plurality of planes may form a die. A plurality of dies form a device, and each device corresponds to one channel.

In addition, in many applications, a controller combines some blocks into a super block. A feature of the super block in an application is that blocks in the super block are erased or programmed at the same time, and state of use conditions of the blocks in the super block are consistent or similar, for example, the PE cycles and the data retention time.

The 3D TLC differs from the 2D MLC in that logic states of each cell increase from four states (2 bits) to eight states (3 bits), and a voltage signal window that distinguishes between different logic states becomes smaller, increasing a requirement on accuracy of a read voltage. In addition, a quantity of pages in the block and a quantity of blocks in the die gradually increase, and physical inconsistency of layers in a flash increases. Consequently, it is more difficult to set a unified valid read voltage for all pages.

Therefore, to effectively refine the read latency indicator, two problems need to be resolved the read voltage varies with a use condition, and there is a physical difference between layers in the flash. Based on this, the embodiments of this application provide a read latency reduction method and an apparatus, to refine the read latency indicator in the QoS.

Figure 2:
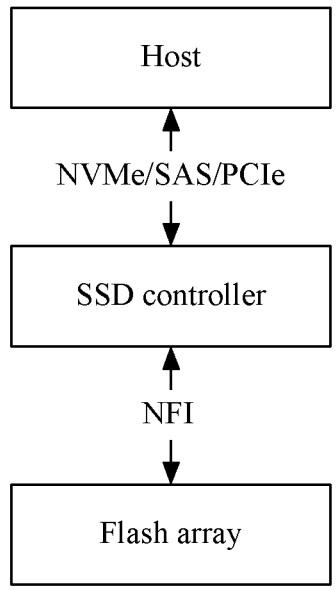
FIG. 2 is a schematic structural diagram of a communications system according to an embodiment of this application.

FIG. 2 is a hardware architectural diagram of a communications system applied to an embodiment of this application. Referring to FIG. 2, the system includes a host, an SSD controller, and a flash array, and the host may store/read data in the flash array using the SSD controller. The host may be connected to a front end of the SSD controller using a plurality of interfaces such as Non-Volatile Memory Express (NVMe)/Serial Attached Small Computer System Interface (SAS)/Peripheral Component Interconnect Express (PCIe), a back end of the SSD controller may be connected to the flash array using NFI, and the host performs an operation, such as reading, writing, or erasing, on the data in the flash array using the SSD controller.

Figure 3:
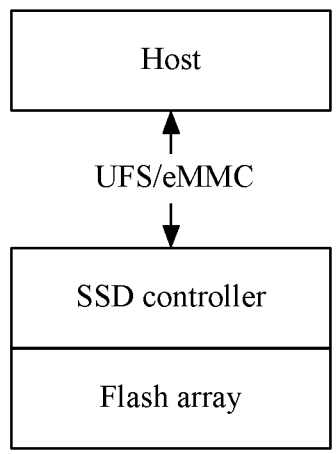
FIG. 3 is a schematic structural diagram of another communications system according to an embodiment of this application.

Optionally, FIG. 3 is a hardware architectural diagram of another communications system applied to an embodiment of this application. A controller in the system is similar to the SSD controller in the system shown in FIG. 2. A difference lies in that the controller in the system shown in FIG. 3 and a flash array are encapsulated into an independent chip, and a host is connected to the controller using an interface such as Universal Flash Storage (UFS)/embedded MultiMediaCard (eMMC), and stores and reads data using the interface. For example, the chip obtained by encapsulating the controller and the flash array may be applied to a mobile terminal such as a mobile phone, a tablet computer, or a wearable device.

Figure 4:
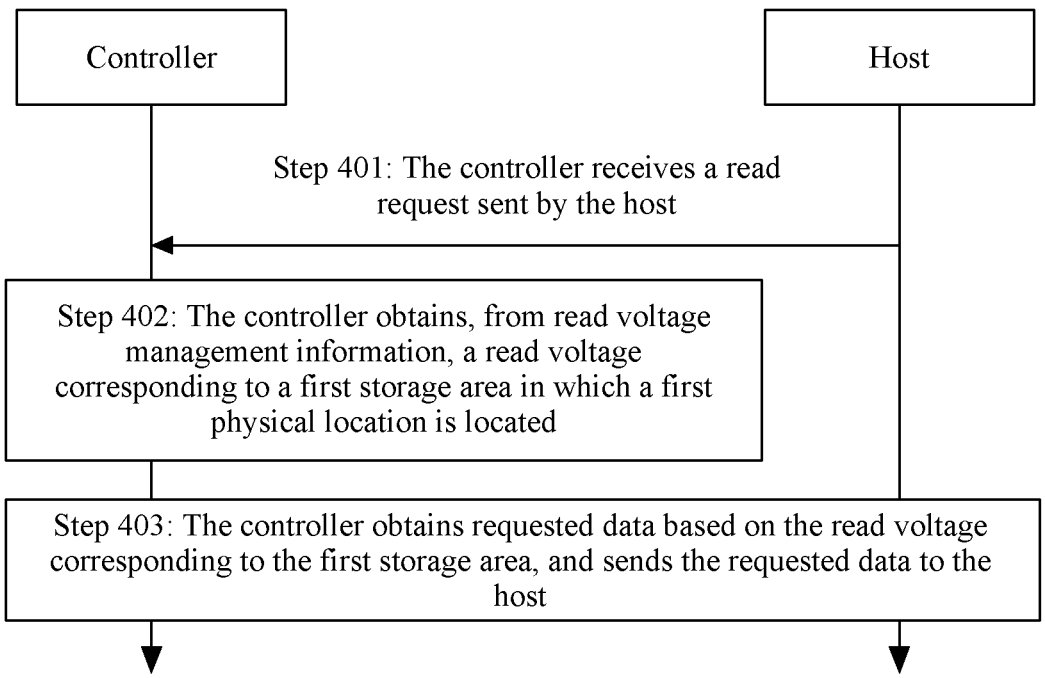
FIG. 4 is a schematic flowchart of a read latency reduction method according to an embodiment of this application.

FIG. 4 is a schematic flowchart of a read latency reduction method according to an embodiment of this application. The method may be applied to the foregoing communications system shown in FIG. 2 or FIG. 3. Referring to FIG. 4, the method includes the following several steps.

Step 401. A controller receives a read request sent by a host, where the read request includes location indication information of requested data.

When the host needs to read a piece of data from a flash array managed by the controller, the host may send a read request to the controller, where data requested using the read request may be referred to as requested data, and the read request may carry location indication information. The location indication information may be used to indicate a logical address, in an embodiment, a logical address used by the host to access the requested data. A mapping relationship exists between the logical address and a physical address. A physical location of the requested data in the flash array may be determined based on the logical address of the requested data. In actual application, the location indication information may also be other information that has a correspondence with the physical location. For example, the location indication information may be a value of Key, and a corresponding value of Value is obtained using a preset correspondence between a Key and a Value. The value of Value may be a physical location of data. This is not limited in this embodiment of this application.

Specifically, when the controller receives the read request sent by the host, the controller may obtain, based on the location indication information, the physical address at which the requested data is stored in the flash array. Herein, the physical address of the requested data is referred to as a first physical location.

Step 402. The controller obtains, from read voltage management information, a read voltage corresponding to a first storage area in which a first physical location is located. The flash array includes a plurality of storage areas. Physical characteristics of a plurality of physical locations included in a same storage area are identical or similar. The read voltage management information includes a correspondence between a storage area and a read voltage. The read voltage in the read voltage management information is dynamically updated.

Each of the plurality of storage areas may include at least one storage unit. Each storage unit may be represented using a corresponding physical location. A plurality of physical locations included in one storage area may be physical locations corresponding to at least one storage unit included in the storage area. Physical characteristics of a plurality of physical locations included in a same storage area are identical or similar, in other words, physical characteristics of storage units included in the same storage area are identical or similar. Physical characteristics of a plurality of physical locations included in different storage areas are different, in other words, physical characteristics of storage units included in different storage areas are different. Physical characteristics of a storage unit herein may include a plurality of aspects, for example, a geometric dimension of a nanoscale, an electrical characteristic of a material, a structure of a storage unit combination, and an internal control circuit. In this embodiment of this application, that physical characteristics of two storage units are identical or similar means that a difference between the physical characteristics of the two storage units is relatively small. For example, if a parameter corresponding to the physical characteristics of the two storage units is less than a specified threshold, or a plurality of parameters corresponding to the physical characteristics of the two storage units are less than respective corresponding specified thresholds, it is determined that the difference between the physical characteristics of the two storage units is relatively small. That physical characteristics of two storage units are different means that the difference between the physical characteristics of the two storage units is relatively large. For example, if a parameter corresponding to the physical characteristics of the two storage units is greater than a specified threshold, or a plurality of parameters corresponding to the physical characteristics of the two storage units are greater than respective corresponding specified thresholds, it is determined that the difference between the physical characteristics of the two storage units is relatively large.

In addition, the physical characteristics of the storage unit are related to a read voltage characteristic corresponding to the storage unit. A read voltage is a corresponding conversion voltage when an analog signal is converted into a digital signal. The read voltage characteristic may refer to a change rule of a corresponding error parameter when the read voltage is read using different devices under different conditions (for example, different temperatures, different times, different PEs, different data retention times, and different read counts). Specifically, a difference between read voltage characteristics corresponding to a plurality of storage units whose physical characteristics are identical or similar is relatively small, and a difference between read voltage characteristics corresponding to a plurality of storage units whose physical characteristics are different is relatively large. Therefore, physical characteristics of storage units included in a same storage area are identical or similar, and a difference between read voltage characteristics corresponding to the storage units included in the same storage area is relatively small such that one storage area may correspond to one read voltage. Physical characteristics of storage units included in different storage areas are different, and a difference between read voltage characteristics corresponding to the storage units included in the different storage areas is relatively large such that different storage areas may correspond to different read voltages.

In addition, for the plurality of storage areas included in the flash array, read voltage characteristics of storage units included in a same storage area are identical or similar, and read voltage characteristics of storage units included in different storage areas are different. When read voltage characteristics of the plurality of storage units are identical or similar, in an embodiment, a difference between the read voltage characteristics of the plurality of storage units is relatively small, the plurality of storage units may belong to a same storage area. When read voltage characteristics of the plurality of storage units are different, in an embodiment, a difference between the read voltage characteristics of the plurality of storage units is relatively large, the plurality of storage units may belong to different storage areas. A method for determining a relatively small or relatively large difference between the read voltage characteristics may be similar to a method for determining a relatively small or relatively large difference between the physical characteristics. In this embodiment of this application, a plurality of physical locations whose physical characteristics are identical or similar and whose read voltage characteristics are identical or similar are allocated to a same storage area, and correspond to one read voltage such that system overheads can be reduced.

For each of the plurality of storage areas, the read voltage management information may include a correspondence between each storage area and a read voltage. The read voltage included in the read voltage management information is dynamically updated, in other words, the read voltage corresponding to each storage area in the read voltage management information is refreshed in a timely manner in order to ensure accuracy of the read voltage corresponding to each storage area.

Specifically, when the controller receives the read request, the controller may determine, based on the first physical location included in the read request, a storage area in which the first physical location is located in the plurality of storage areas. Herein, the storage area in which the physical location is located is referred to as the first storage area. The controller obtains, based on the first storage area, the read voltage corresponding to the first storage area from the correspondence that is between a storage area and a read voltage and that is included in the dynamically updated read voltage management information. Accuracy of the obtained read voltage is relatively high such that a success rate of reading data from the first storage area using the read voltage is relatively high.

Optionally, when the controller receives the read request, the controller may further choose, according to a specific read request policy, whether to obtain the read voltage using the read voltage management information. When the controller chooses, according to the specific read request policy, to obtain the read voltage (that is, select yes) using the read voltage management information, the corresponding read voltage is obtained based on the foregoing step 402. The specific read request policy may be preset. For different read requests, different read request policies may be set, or a same read request policy may be set. This is not further limited in this embodiment of this application.

Further, the flash array may include a plurality of devices, and an internal structure of each device may be shown in FIG. 1A and FIG. 1B. When each storage area in the flash array may include at least one storage unit, the storage unit may include at least one of the following a device, a die, a plane, a block, a super block, a layer, a sub-block, a WL, and a page. In other words, a division granularity for dividing the flash array into the plurality of storage areas may include at least one of the foregoing.

For example, when the division granularity is device, one storage area may include at least one device. When the division granularity is die, one storage area may include at least one die. When the division granularity is plane, one storage area may include at least one plane. When the division granularity is block, one storage area may include at least one block. When the division granularity is super block, one storage area may include at least one super block. When the division granularity is layer, one storage area may include at least one layer. When the division granularity is sub-block, one storage area may include at least one sub-block. When the division granularity is WL, one storage area may include at least one WL. When the division granularity is page, one storage area may include at least one page.

Optionally, use conditions (for example, PE/Retention Time) of blocks in the flash array are usually different such that different blocks may be located in different storage areas. In addition, a read voltage characteristic of a page in a block is related to a physical location of the page in the block. Therefore, pages whose read voltage characteristics are identical or similar may be allocated to a same storage area. This is not further limited in this embodiment of this application.

Step 403. The controller obtains the requested data based on the read voltage corresponding to the first storage area, and sends the requested data to the host.

When the controller obtains the read voltage corresponding to the first storage area, the controller may obtain, from the first storage area based on the read voltage corresponding to the first storage area, the requested data stored at the first physical location. Then, the controller may send the requested data to the host such that the host may receive the requested data.

In this embodiment of this application, when the controller receives the read request sent by the host, the controller may obtain, from the correspondence that is between a storage area and a read voltage and that is included in the read voltage management information and based on the first physical location indicated by the location indication information included in the read request, the read voltage corresponding to the first storage area in which the first physical location is located. Because physical characteristics and read voltage characteristics of a plurality of physical locations included in the first storage area are identical or similar, and the read voltage in the read voltage management information is dynamically updated, accuracy of the obtained read voltage can be ensured. When the requested data is obtained based on the read voltage, a first read success rate can be improved, a count of reads can be reduced, and a read latency can be reduced.

Figure 5:
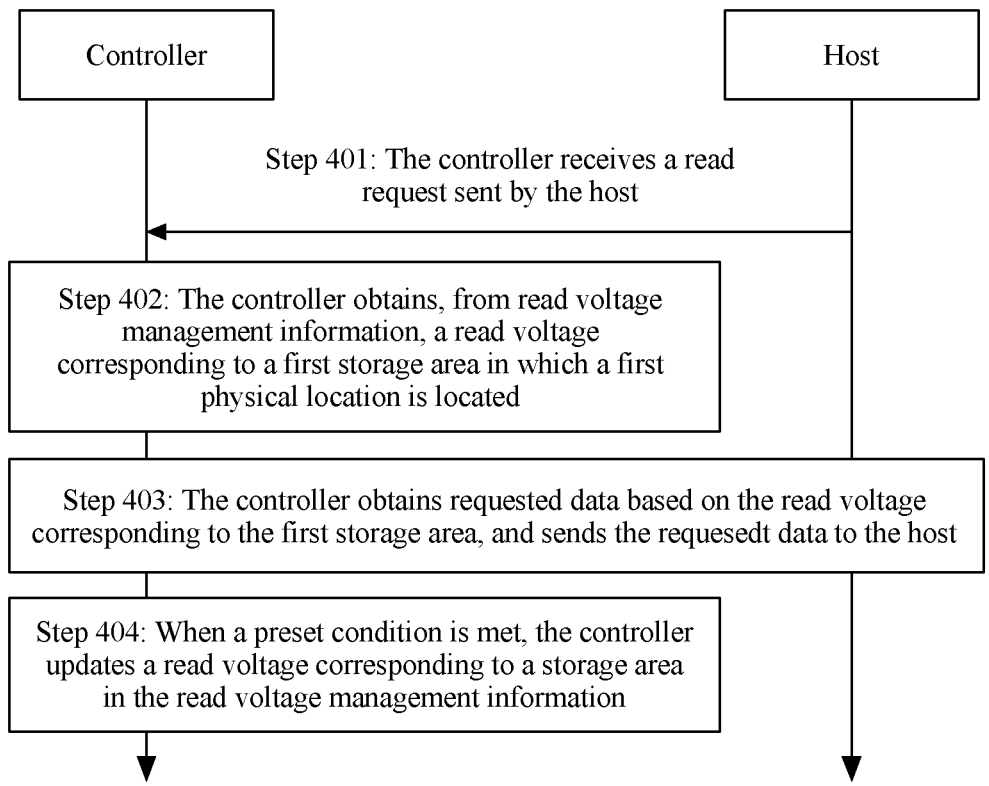
FIG. 5 is a schematic flowchart of another read latency reduction method according to an embodiment of this application.

Further, referring to FIG. 5, the read voltage in the read voltage management information is dynamically updated, and the method may include step 404. For any storage area in the plurality of storage areas, when a preset condition is met, the controller updates a read voltage corresponding to the storage area in the read voltage management information. Step 404 and step 401 to step 403 may be performed without a sequence.

When the preset condition is met, the controller may determine, using a specific online read voltage optimization algorithm, a valid read voltage corresponding to the storage area, and update, based on the valid read voltage, the read voltage corresponding to the storage area in the read voltage management information. When the controller dynamically updates the read voltage corresponding to the storage area in the read voltage management information, the controller may actively update the read voltage corresponding to the storage area, or passively update the read voltage corresponding to the storage area. Both actively updating the read voltage in the read voltage management information and passively updating the read voltage in the read voltage management information can ensure that the read voltage in the read voltage management information is dynamically updated. The following separately describes in detail the two manners.

In a first manner, that the controller actively updates the read voltage corresponding to the storage area may further include, when the controller is in a system idle time window or a preset update period is met, determining, by the controller, a first error parameter at the read voltage corresponding to the storage area, and when the first error parameter is greater than or equal to a first threshold, updating, by the controller, the read voltage corresponding to the storage area in the read voltage management information.

That the controller is in a system idle time window may mean that the controller is in an idle state, and the idle state may be understood as that load of read/write IO of the controller is less than a specific value such that the controller is relatively idle. The preset update period may be set in advance, and the preset update period may include one period, or may include a plurality of different periods. Setting of a preset update period corresponding to a storage area may be related to a use state (for example, PE and read counts) of the storage area, or may be related to an average service life of the plurality of storage areas included in the flash array. For example, the average service life of the plurality of storage areas may be represented using an average PE. When the average PE is relatively large (for example, early life), a relatively long preset update period may be used, and when the average PE is relatively small (for example, late life), a relatively short preset update period may be used.

In addition, the first error parameter may be used to indicate an error level in the read data, and the first error parameter may be an error bit quantity or a residual bit error rate (RBER). The first threshold may be a preset error tolerance threshold. If the first error parameter is less than the first threshold, it indicates that the error level is within an error tolerance range, or if the first error parameter is greater than or equal to the first threshold, it indicates that the error level is not within an error tolerance range.

Specifically, when the controller is in the system idle time window or the preset update period is met, the controller uses a currently stored read voltage corresponding to the storage area in the read voltage management information as a detected read voltage, and samples, based on the detected read voltage, a physical location included in the storage area, to obtain an error parameter under the detected read voltage and use the obtained error parameter as the first error parameter. If the first error parameter is less than the first threshold, the controller may determine that the read voltage corresponding to the storage area is valid, and therefore does not update the read voltage. If the first error parameter is greater than or equal to the first threshold, the controller may determine that the read voltage corresponding to the storage area is invalid, and needs to update the read voltage.

When the controller updates the read voltage corresponding to the storage area, the controller may determine a current valid read voltage through an attempt. For example, the controller may test error parameters at a plurality of voltages in a manner of gradually increasing or decreasing the voltage, and determine a read voltage with a minimum error parameter as the current valid read voltage such that the read voltage corresponding to the storage area in the read voltage management information is replaced with the current valid read voltage to update the read voltage corresponding to the storage area.

In the foregoing method for actively updating the read voltage in the read voltage management information, the controller actively updates the read voltage in the read voltage management information in each system idle time window, or actively updates the read voltage in the read voltage management information in each preset update period such that the read voltage in the read voltage management information is updated once every other time. Therefore, actively updating the read voltage in the read voltage management information can make the read voltage in the read voltage management information be in a dynamically updated state, thereby ensuring that the read voltage in the read voltage management information is real-time and effective.

In addition, when the preset update period is used to trigger the controller to actively update the read voltage corresponding to the storage area, the triggering may be performed in a timer interruption manner. Another forced signal may also be used to trigger the controller to actively update the read voltage corresponding to the storage area. A specific forced signal may be preset. This is not limited in this embodiment of this application.

In a second manner, that the controller passively updates the read voltage corresponding to the storage area may further include, when a second error parameter of requested data that is first read is greater than or equal to a first threshold at the read voltage corresponding to the storage area, updating, by the controller, the read voltage corresponding to the storage area in the read voltage management information.

The requested data that is first read is requested data that is read by the controller from the storage area for the first time based on the read voltage corresponding to the storage area in read voltage management information. The requested data is data obtained based on a read request sent by a host, and is not data that is obtained by the controller through active sampling.

Specifically, the controller reads the requested data from the storage area for the first time at the read voltage corresponding to the storage area, and an error parameter of the read requested data is the second error parameter. If the second error parameter is less than the first threshold, the controller may determine that the read voltage corresponding to the storage area is valid, and therefore does not update the read voltage. If the second error parameter is greater than or equal to the first threshold, the controller may determine that the read voltage corresponding to the storage area is invalid, and needs to update the read voltage.

It should be noted that the controller may also update the read voltage corresponding to the storage area (that is, obtain a current valid read voltage) in a manner of gradually increasing or decreasing the voltage. A specific implementation process is consistent with the description in the first manner. Details are not described herein again in this embodiment of this application.

When the controller updates read voltages corresponding to the plurality of storage areas in the read voltage management information, the controller may first determine a storage area with an invalid read voltage, and then the controller may update only the read voltage of the storage area with the invalid read voltage in the read voltage management information. In this embodiment of this application, when updating the read voltage corresponding to the storage area in the read voltage management information, the controller first determines whether the stored read voltage corresponding to the storage area in the read voltage management information is valid, and updates the read voltage when determining that the read voltage is invalid such that unnecessary operations can be avoided, and bandwidth and load overheads of a system can be reduced.

In the foregoing method for passively updating the read voltage in the read voltage management information, when the read voltage in the read voltage management information is invalid, the controller updates the read voltage to the current valid read voltage. Therefore, in each period of time, when one or more invalid read voltages appear in the read voltage management information, the controller updates the one or more read voltages. Therefore, passively updating the read voltage in the read voltage management information can make the read voltage in the read voltage management information be in a dynamically updated state, thereby ensuring that the read voltage in the read voltage management information is real-time and effective.

Figure 6:
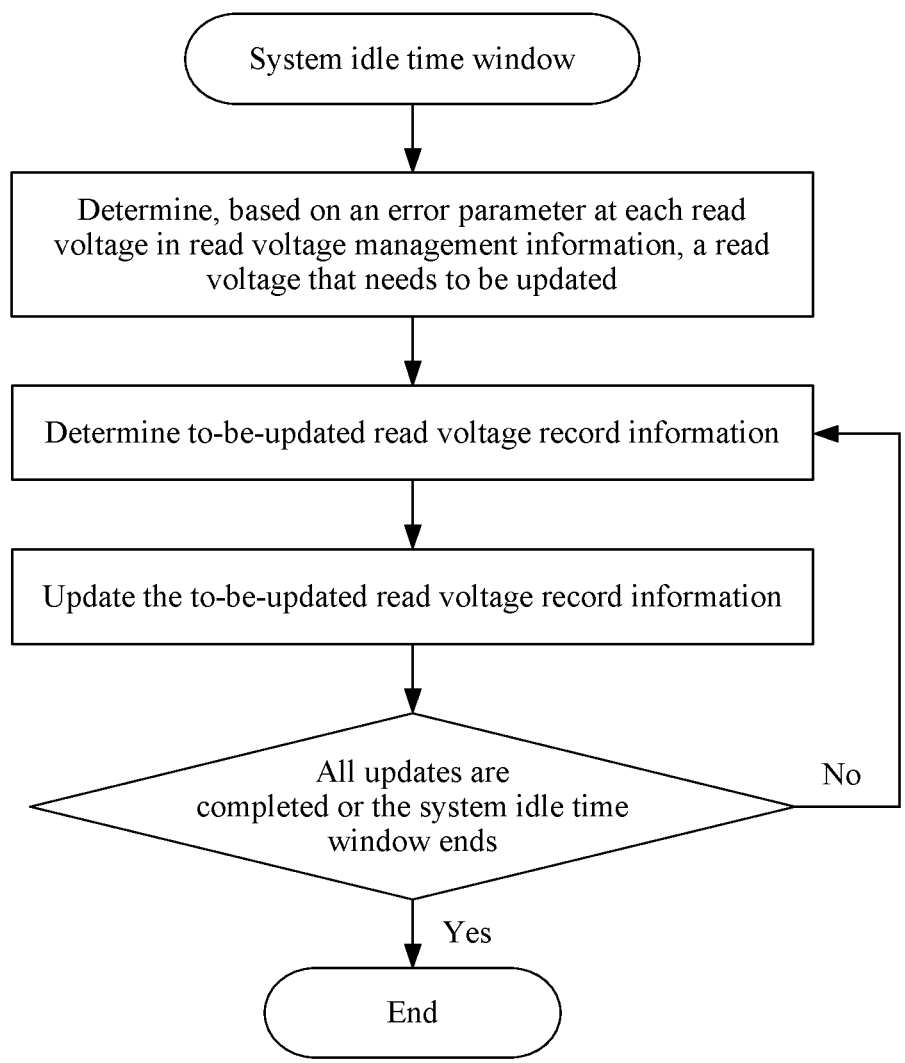
FIG. 6 is a schematic flowchart of updating read voltage management information according to an embodiment of this application.
Figure 7:
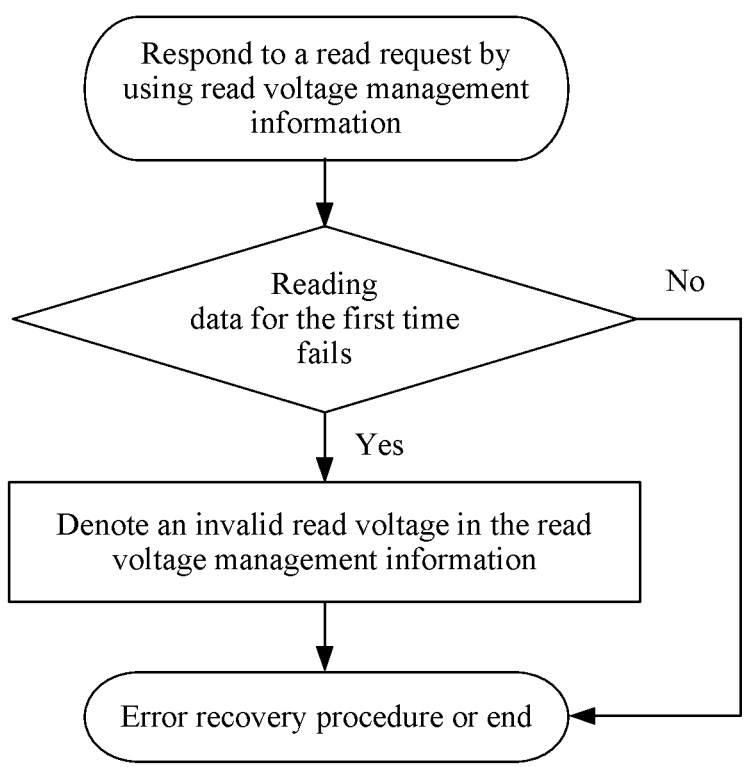
FIG. 7 is another schematic flowchart of updating read voltage management information according to an embodiment of this application.

For ease of understanding, a process in which the controller actively updates the read voltage management information and a process in which the controller passively updates the read voltage management information are respectively described using processing procedures shown in FIG. 6 and FIG. 7 as examples.

FIG. 6 is a flowchart in which a controller actively updates read voltage management information. An example in which the controller is in a system idle time window is used. Specifically, it is assumed that all read voltages in the read voltage management information need to be updated, and when the controller is in the system idle time window, the controller may determine an error parameter corresponding to each read voltage in the read voltage management information, and determine a read voltages that needs to be updated in the read voltage management information (for example, when an error parameter corresponding to a read voltage is less than a first threshold, it is determined that the read voltage does not need to be updated, and when an error parameter corresponding to a read voltage is greater than or equal to the first threshold, it is determined that the read voltage needs to be updated) in order to obtain to-be-updated read voltage record information (namely, a storage record of an invalid read voltage in the read voltage management information). The controller updates the to-be-updated read voltage record information using a read voltage update method (for example, the method provided in step 404). The procedure ends after all to-be-updated read voltage record information is updated, or the system idle time window expires.

FIG. 7 is a flowchart in which a controller passively updates read voltage management information. Specifically, the controller receives a read request sent by a host, obtains a corresponding read voltage from the read voltage management information based on physical location information included in the read request (that is, responds to the read request using the read voltage management information), and denotes the read voltage in the read voltage management information as an invalid read voltage when obtaining the requested data for the first time based on the read voltage fails (that is, reading data for the first time fails). Then, the procedure ends or is followed by an error recovery procedure (that is, updating the invalid read voltage).

It should be noted that a step of determining, by the controller, the invalid read voltage in the read voltage management information and a step of updating the invalid read voltage in the read voltage management information may be performed synchronously or asynchronously. In an embodiment, the controller may first determine all invalid read voltages in the read voltage management information, and then update all the invalid read voltages one by one. Alternatively, each time the controller determines one invalid read voltage in the read voltage management information, the controller updates the invalid read voltage, and then determines a next invalid read voltage and updates the next invalid read voltage, and so on. Alternatively, the controller determines an invalid read voltage in the read voltage management information while updating a determined invalid read voltage. This is not further limited in this embodiment of this application.

In actual application, when the controller updates the read voltage management information, if the read voltage management information resides in a fast storage medium such as a memory, the read voltage management information needs to be backed up in a non-volatile storage medium. During system initialization, the read voltage management information is imported from the non-volatile storage medium into the fast storage medium to complete the initialization. Alternatively, the controller directly stores the read voltage management information in a storage medium that features both fast access and non-volatility.

Further, the controller may not only obtain the read voltage from the read voltage management information and obtain the requested data based on the read voltage, but also update the read voltage in the read voltage management information. For ease of understanding, an operation of obtaining the read voltage from the read voltage management information and obtaining the requested data by the controller is referred to as an obtaining operation. In this case, a state of the read voltage management information may be referred to as an operation phase. An operation of updating the read voltage in the read voltage management information by the controller is referred to as an update operation, and in this case, a state of the read voltage management information may be referred to as a maintenance phase. The following further describes a relationship between the obtaining operation and the update operation.

For any storage area in a plurality of storage areas, when the controller updates, within a first time period, a read voltage corresponding to the storage area in the read voltage management information, and obtains, within a second time period, the read voltage corresponding to the storage area from the read voltage management information, the first time period and the second time period do not overlap. In other words, for a read voltage corresponding to one storage area in the read voltage management information, the controller cannot simultaneously perform the obtaining operation and the update operation. Alternatively, one storage area in the read voltage management information cannot be on the operation phase and the maintenance phase at the same time.

For any two storage areas in the plurality of storage areas, when the controller updates, within a third time period, a read voltage corresponding to one storage area in the read voltage management information, and obtains, within a fourth time period, a read voltage corresponding to the other storage area from the read voltage management information, the third time period and the fourth time period overlap, or the third time period and the fourth time period do not overlap. In other words, the controller cannot simultaneously perform the obtaining operation and the update operation on a read voltage corresponding to one storage area in the read voltage management information in a same time period. In other words, for read voltages corresponding to different storage areas in the read voltage management information, the controller may simultaneously perform the obtaining operation and the update operation, or may not simultaneously perform the obtaining operation and the update operation. Alternatively, different storage areas in the read voltage management information may be on the operation phase and the maintenance phase at the same time, or may not be on the operation phase and the maintenance phase at the same time.

Figure 8:
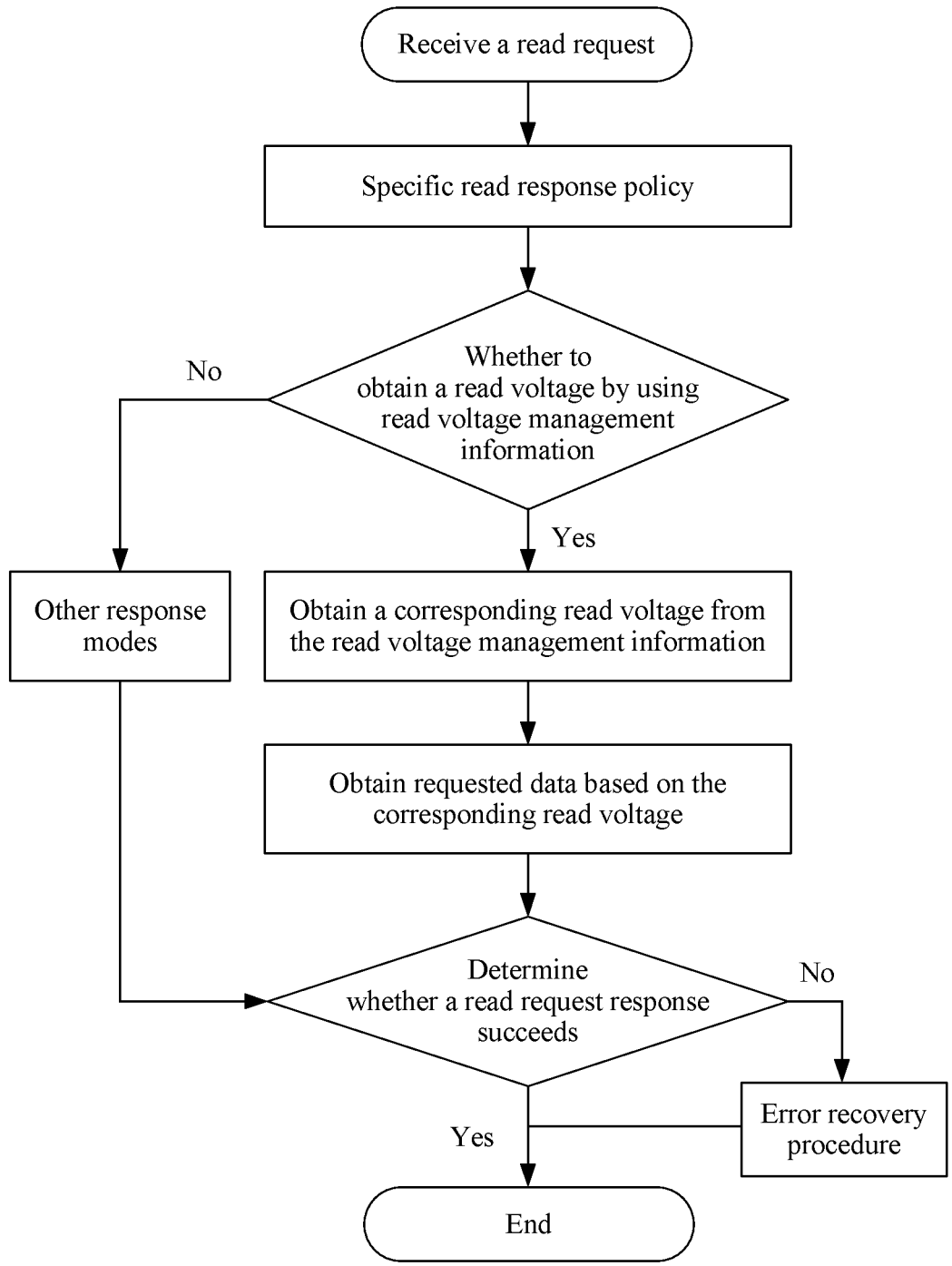
FIG. 8 is a schematic flowchart of processing a read request according to an embodiment of this application.

For ease of understanding, the solution in this embodiment of this application is described using a read request processing flowchart shown in FIG. 8 as an example. As shown in FIG. 8, when receiving a read request sent by a host, a controller may determine, according to a specific read response policy, whether a corresponding read voltage is to be obtained using read voltage management information. If the corresponding read voltage is not to be obtained using the read voltage management information, the controller performs processing in another response manner in other approaches. If the corresponding read voltage is to be obtained using the read voltage management information, the controller obtains the corresponding read voltage from the read voltage management information based on physical location information included in the read request, obtains requested data based on the corresponding read voltage, and determines whether a read request response succeeds. If yes (that is, the response succeeds), the procedure ends. If no (that is, the response fails), an error recovery procedure is started.

Figure 9:
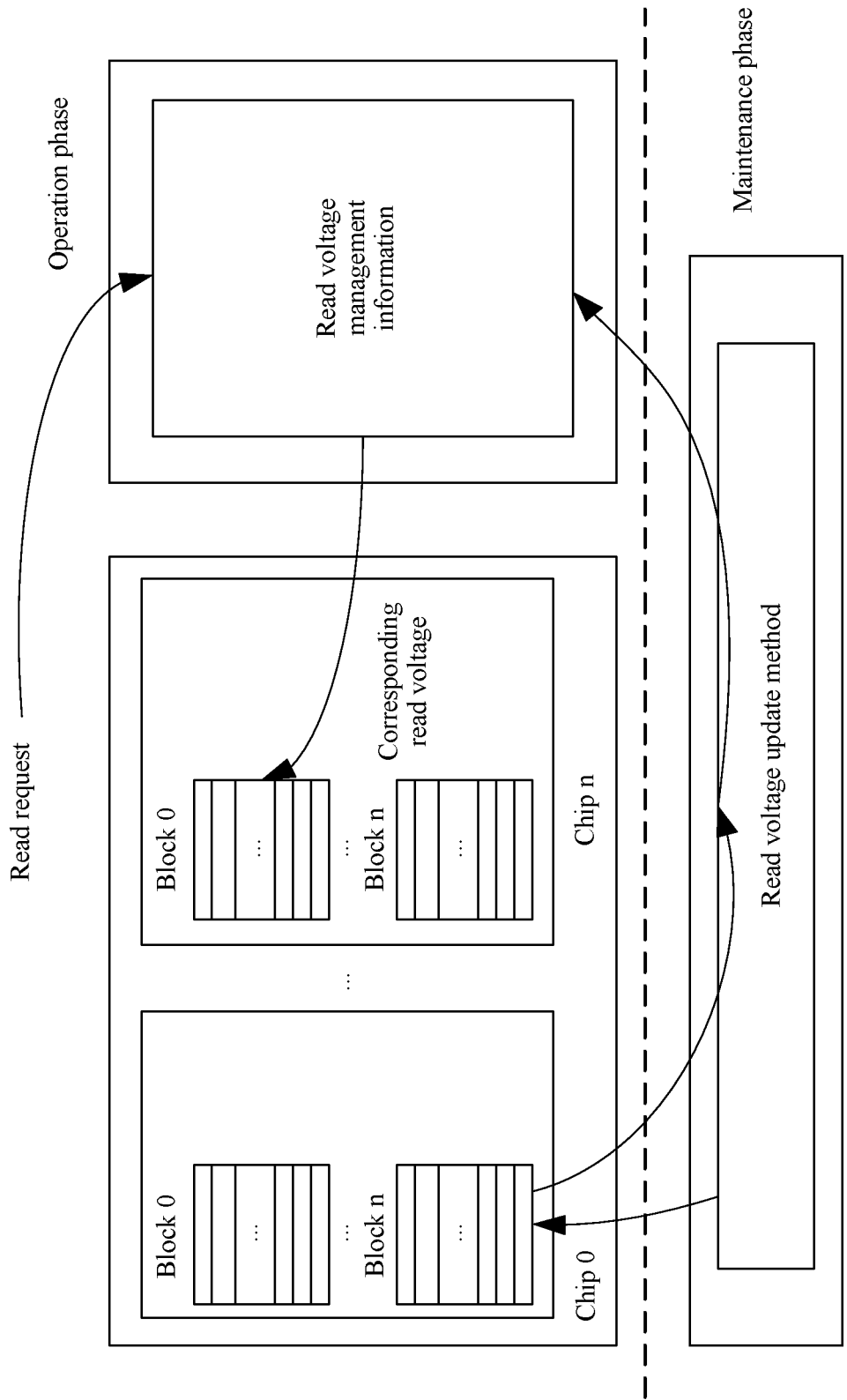
FIG. 9 is a schematic diagram of performing an operation on read voltage management information according to an embodiment of this application.

For example, FIG. 9 is a schematic diagram of different operations corresponding to read voltage management information on an operation phase and a maintenance phase. In FIG. 9, that a flash array includes a device 0 to a device n, and each device includes a block 0 to a block n is used as an example for description. Specifically, on the operation phase, a controller obtains, based on a read request sent by a host, assuming that a physical location included in the request is a block 0 in the device n, a read voltage corresponding to the block 0 from the read voltage management information, obtains requested data from the flash array based on the read voltage corresponding to the block 0, and then returns the requested data to the host. On the maintenance phase, when determining that a read voltage corresponding to the block n in the read voltage management information is an invalid read voltage, the controller determines, using a read voltage update method (for example, the method provided in step 404), a currently valid read voltage corresponding to the block n, and then updates the currently valid read voltage to the read voltage management information.

The solutions provided in the embodiments of this application are mainly described above from a perspective of interaction between the devices. It may be understood that, to implement the foregoing functions, the devices such as the host and the controller include corresponding hardware structures and/or software modules for performing the functions. A person skilled in the art should easily be aware that, in combination with the examples described in the embodiments disclosed in this specification, devices and algorithm steps can be implemented by hardware or a combination of hardware and computer software in this application. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this application.

In the embodiments of this application, the controller may be divided into functional modules based on the foregoing method examples. For example, each functional module may be obtained through division for a corresponding function, or two or more functions may be integrated into one processing module. The integrated module may be implemented in a form of hardware, or may be implemented in a form of a software functional module. It should be noted that the module division in the embodiments of this application is an example, and is merely logical function division. There may be another division manner in actual implementation.

Figure 10:
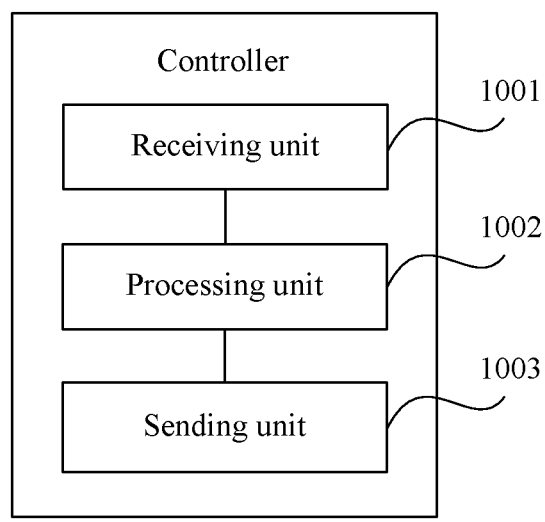
FIG. 10 is a schematic structural diagram of a controller according to an embodiment of this application.

When each functional module is obtained through division for a corresponding function, an embodiment of this application provides a possible schematic structural diagram of a controller used in the foregoing embodiments. Referring to FIG. 10, the controller includes a receiving unit 1001, a processing unit 1002, and a sending unit 1003. The receiving unit 1001 is configured to support the controller in performing step 401 in the read latency reduction method provided in FIG. 4 or FIG. 5. The processing unit 1002 is configured to support the controller in performing a process of obtaining the requested data in step 402 and step 403 in the read latency reduction method provided in FIG. 4 or FIG. 5, and step 404 in FIG. 5, and/or another process of the technology described in this specification. The sending unit 1003 is configured to support the controller in performing a process of sending the requested data to the host in step 403 in the read latency reduction method provided in FIG. 4 or FIG. 5. For specific descriptions, refer to related descriptions in the foregoing embodiments. Details are not described herein again in this embodiment of this application.

In hardware implementation, the processing unit 1002 may be a processor, the receiving unit 1001 may be a receiver, and the sending unit 1003 may be a transmitter. The receiver and the transmitter may constitute a communications interface.

Figure 11:
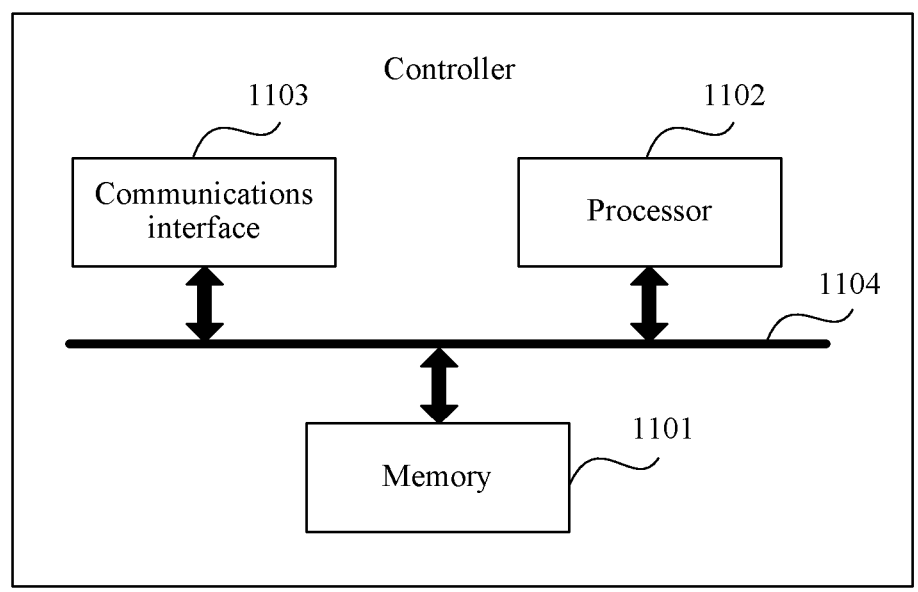
FIG. 11 is a schematic structural diagram of another controller according to an embodiment of this application.

An embodiment of this application provides a possible schematic diagram of a logical structure of a controller used in the foregoing embodiments. Referring to FIG. 11, the controller includes a processor 1102, a communications interface 1103, a memory 1101, and a bus 1104. The processor 1102, the communications interface 1103, and the memory 1101 are connected to each other using the bus 1104. In this embodiment of this application, the processor 1102 is configured to control and manage an action of the controller. For example, the processor 1102 is configured to support the controller in performing a process of obtaining the requested data in step 402 and step 403 in the read latency reduction method provided in FIG. 4 or FIG. 5, and/or another process of the technology described in this specification. The communications interface 1103 is configured to support the controller for communication. The memory 1101 is configured to store program code and data of the controller.

The processor 1102 may be a central processing unit, a general-purpose processor, a digital signal processor, an application-specific integrated circuit, a field programmable gate array or another programmable logic device, a transistor logic device, a hardware component, or any combination thereof, and may implement or execute various example logical blocks, modules, and circuits that are described with reference to the content disclosed in this application. Alternatively, the processor 1102 may be a combination of processors implementing a computing function, for example, a combination of one or more microprocessors, or a combination of a digital signal processor and a microprocessor. The bus 1104 may be a Peripheral Component Interconnect (PCI) bus, an extended industry standard architecture (EISA) bus, or the like. The bus 1104 may be classified into an address bus, a data bus, a control bus, and the like. For ease of representation, only one thick line is used to represent the bus in FIG. 11, but this does not mean that there is only one bus or only one type of bus.

An embodiment of this application further provides a system, where the system includes a host, a controller, and a flash array, the flash array includes a plurality of storage areas, and physical characteristics of a plurality of physical locations included in a same storage area are identical or similar. The system may be the system shown in FIG. 2 or FIG. 3. In this embodiment of this application, the host may be configured to, the flash array, send a read request to the controller, and receive requested data sent by the controller. The controller may be configured to perform the steps of the controller in the read latency reduction method provided in FIG. 4 or FIG. 5. The controller is configured to perform step 401 to step 403 in FIG. 4, or is configured to perform step 401 to step 404 in FIG. 5, and/or another process of the technology described in this specification. For a specific process, refer to the foregoing description in the embodiment shown in FIG. 4 or FIG. 5. Details are not described herein again in this embodiment of this application.

Another embodiment of this application further provides a computer-readable storage medium. The computer-readable storage medium stores a computer executable instruction. When at least one processor of a device executes the computer executable instruction, the device performs the read latency reduction method provided in FIG. 4 or FIG. 5.

Another embodiment of this application further provides a computer program product, where the computer program product includes a computer executable instruction, and the computer executable instruction is stored in a computer-readable storage medium. At least one processor of a device may read the computer executable instruction from the computer-readable storage medium. The at least one processor executes the computer executable instruction such that the device implements the read latency reduction method provided in FIG. 4 or FIG. 5.

In this embodiment of this application, when the controller receives the read request sent by the host, the controller may obtain, from a correspondence that is between a storage area and a read voltage and that is included in read voltage management information and based on a first physical location indicated by location indication information included in the read request, a read voltage corresponding to a first storage area in which the first physical location is located. Because physical characteristics and read voltage characteristics of a plurality of physical locations included in the first storage area are identical or similar, and the read voltage in the read voltage management information is dynamically updated, accuracy of the obtained read voltage can be ensured. When the requested data is obtained based on the read voltage, a first read success rate can be improved, a count of reads can be reduced, and a read latency can be reduced.

Finally, it should be noted that, the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A read latency reduction method implemented by a controller, wherein the read latency reduction method comprises:
receiving a read request from a host, wherein the read request comprises location indication information of requested data;
obtaining a read voltage corresponding to a physical location of a storage area based on read voltage management information from the physical location, wherein the physical location corresponds to the requested data in a flash array, wherein the read voltage management information comprises a correspondence between the storage area and a read voltage, and wherein the read voltage in the read voltage management information is dynamically updated;
obtaining the requested data based on the read voltage;
sending the requested data to the host;
determining a first error parameter at the read voltage when the controller is in a system idle time window or a preset update period has lapsed; and
updating the read voltage when the first error parameter is greater than or equal to a first threshold.

2. The read latency reduction method of claim 1, wherein physical characteristics of physical locations in different storage areas are different, or read voltage characteristics of the physical locations in the different storage areas are different.

3. The read latency reduction method of claim 1, wherein the preset update period is related to one of a use state of the storage area or an average service life of a plurality of storage areas.

4. The read latency reduction method of claim 1, further comprising updating the read voltage when a second error parameter of request data that is first read is greater than or equal to the first threshold at the read voltage corresponding to the storage area.

5. The read latency reduction method of claim 1, wherein a first time period and a second time period do not overlap for any storage area in a plurality of storage areas when the controller updates the read voltage within the first time period and obtains the read voltage within the second time period, or a third time period and a fourth time period do not overlap for any two storage areas in the plurality of storage areas when the controller updates a first read voltage corresponding to one storage area in the read voltage management information within the third time period and obtains a second read voltage corresponding to another storage area from the read voltage management information within the fourth time period.

6. The read latency reduction method of claim 1, wherein the storage area comprises a memory comprising at least one of the following: a device, a die, a plane, a block, a super block, a layer, a sub-block, a word line (WL), or a page.

7. A system, wherein the system comprises:
a host configured to:
send a read request comprising location indication information of requested data; and
receive the requested data;
a controller coupled to the host and configured to:
receive the read request from the host;
obtain a read voltage corresponding to a physical location of a first storage area based on read voltage management information from the physical location when receiving the read request, wherein the physical location corresponds to the requested data in a flash array coupled to the controller, wherein the read voltage management information comprises a correspondence between a storage area and a read voltage, wherein the storage area comprises the first storage area, and wherein the read voltage in the read voltage management information is dynamically updated;
obtain the requested data based on the read voltage corresponding to the first storage area; and
send the requested data to the host;
determine a first error parameter at the read voltage when the controller is in a system idle time window or a preset update period has lapsed; and
update the read voltage when the first error parameter is greater than or equal to a first threshold.

8. The system of claim 7, wherein physical characteristics of physical locations in different storage areas are different, or read voltage characteristics of physical locations in the different storage areas are different.

9. The system of claim 7, wherein the preset update period is related to one of a use state of the storage area or an average service life of a plurality of storage areas in the flash array.

10. The system of claim 7, wherein the controller is further configured to update the read voltage when a second error parameter of request data that is first read is greater than or equal to the first threshold at the read voltage corresponding to the storage area.

11. The system of claim 7, wherein a first time period and a second time period do not overlap for any storage area in a plurality of storage areas in the flash array when the controller updates the read voltage within the first time period and obtains the read voltage within the second time period, or a third time period and a fourth time period do not overlap for any two storage areas in the plurality of storage areas when the controller updates a first read voltage corresponding to one storage area in the read voltage management information within the third time period and obtains a second read voltage corresponding to another storage area from the read voltage management information within the fourth time period.

12. The system of claim 7, wherein the storage area comprises a storage unit comprising at least one of the following: a device, a die, a plane, a block, a super block, a layer, a sub-block, a word line (WL), or a page.

13. A device comprising:
a processor; and
a memory coupled to the processor and storing instructions that, when executed by the processor, cause the device to be configured to:
receive, a read request from a host, wherein the read request comprises location indication information of requested data;
obtain a read voltage corresponding to a physical location of a storage area indicated by the location information based on read voltage management information from the physical location indicated, wherein the physical location corresponds to the requested data in a flash array, wherein the read voltage management information comprises a correspondence between the storage area and a read voltage, and wherein the read voltage is dynamically updated;

obtain the requested data based on the read voltage corresponding to the storage area;

send the requested data to the host;

determine a first error parameter at the read voltage when the device is in a system idle time window or a preset update period has lapsed; and update the read voltage when the first error parameter is greater than or equal to a first threshold.

14. The device of claim 13, wherein physical characteristics of physical locations in different storage areas are different, or read voltage characteristics of physical locations in the different storage areas are different.

15. A computer program product comprising computer-executable instructions for storage on a non-transitory computer-readable medium that, when executed by a processor, cause a device to:

receive, a read request from a host, wherein the read request comprises location indication information of requested data;

obtain a read voltage corresponding to a physical location of a storage area indicated by the location indication information based on read voltage management information from the physical location, wherein the physical location corresponds to the requested data in a flash array, wherein the read voltage management information comprises a correspondence between the storage area and a read voltage, and wherein the read voltage in the read voltage management information is dynamically updated;

obtain the requested data based on the read voltage;

send the requested data to the host;

determine a first error parameter at the read voltage when the device is in a system idle time window or a preset update period has lapsed; and update the read voltage when the first error parameter is greater than or equal to a first threshold.

16. The computer program product of claim 15, wherein physical characteristics of physical locations in different storage areas are different, or read voltage characteristics of physical locations in the different storage areas are different.

17. The device of claim 13, wherein the preset update period is related to one of a use state of the storage area or an average service life of a plurality of storage areas.

18. The device of claim 13, wherein a first time period and a second time period do not overlap for any storage area in a plurality of storage areas when the device updates the read voltage within the first time period and obtains the read voltage within the second time period, or a third time period and a fourth time period do not overlap for any two storage areas in the plurality of storage areas when the device updates a first read voltage corresponding to one storage area in the read voltage management information within the third time period and obtains a second read voltage corresponding to another storage area from the read voltage management information within the fourth time period.

19. The computer program product of claim 15, wherein the preset update period is related to one of a use state of the storage area or an average service life of a plurality of storage areas.

20. The computer program product of claim 15, wherein a first time period and a second time period do not overlap for any storage area in a plurality of storage areas when the device updates the read voltage within the first time period and obtains the read voltage within the second time period, or a third time period and a fourth time period do not overlap for any two storage areas in the plurality of storage areas when the device updates a first read voltage corresponding to one storage area in the read voltage management information within the third time period and obtains a second read voltage corresponding to another storage area from the read voltage management information within the fourth time period.

* * * * *